United States Patent
Murray et al.

(10) Patent No.: US 10,109,586 B2
(45) Date of Patent: *Oct. 23, 2018

(54) SEMICONDUCTOR DEVICE INTERCONNECT STRUCTURES FORMED BY METAL REFLOW PROCESS

(71) Applicant: International Business Machines Corporation, Armonk, NY (US)

(72) Inventors: Conal E. Murray, Yorktown Heights, NY (US); Chih-Chao Yang, Glenmont, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/592,291

(22) Filed: May 11, 2017

(65) Prior Publication Data
US 2017/0243830 A1 Aug. 24, 2017

Related U.S. Application Data

(62) Division of application No. 14/967,618, filed on Dec. 14, 2015, now Pat. No. 9,735,051.

(51) Int. Cl.
*H01L 23/532* (2006.01)
*H01L 23/522* (2006.01)
(Continued)

(52) U.S. Cl.
CPC .. *H01L 23/53238* (2013.01); *H01L 21/76847* (2013.01); *H01L 21/76882* (2013.01);
(Continued)

(58) Field of Classification Search
CPC ......... H01L 21/76879; H01L 21/76802; H01L 21/76838; H01L 21/76807;
(Continued)

(56) References Cited

U.S. PATENT DOCUMENTS 6,107,687 A  8/2000  Fukada et al.
6,239,494 B1  5/2001  Besser et al.
(Continued)

OTHER PUBLICATIONS

List of IBM Patents or Patent Applications Treated as Related.

*Primary Examiner* — Thanh T Nguyen
(74) *Attorney, Agent, or Firm* — Vazken Alexanian; Ryan, Mason & Lewis, LLP

(57) ABSTRACT

Methods are devices are provided in which interconnection structures are formed using metal reflow techniques. For example, a method to fabricate a semiconductor device includes forming an opening in an ILD (inter-level dielectric) layer. The opening includes a via hole and a trench. A layer of diffusion barrier material is deposited to cover the ILD layer and to line the opening with the diffusion barrier material. A layer of first metallic material is deposited on the layer of diffusion barrier material to cover the ILD layer and to line the opening with the first metallic material. A reflow process is performed to allow the layer of first metallic material to reflow into the opening and at least partially fill the via hole with the first metallic material. A layer of second metallic material is deposited to at least partially fill a remaining portion of the opening in the ILD layer.

11 Claims, 6 Drawing Sheets

(51) Int. Cl.
*H01L 21/768* (2006.01)
*H01L 23/528* (2006.01)

(52) U.S. Cl.
CPC .... *H01L 23/5226* (2013.01); *H01L 21/76802* (2013.01); *H01L 21/76883* (2013.01); *H01L 23/528* (2013.01)

(58) Field of Classification Search
CPC ......... H01L 21/76813; H01L 21/76816; H01L 21/76843; H01L 21/76882; H01L 21/7684; H01L 21/76841; H01L 21/76877; H01L 23/528; H01L 23/53209; H01L 23/5329; H01L 23/53238
See application file for complete search history.

(56) References Cited

U.S. PATENT DOCUMENTS

| | | | |
|---|---|---|---|
| 6,787,446 B2 | 9/2004 | Enomoto et al. | |
| 6,900,539 B2 | 5/2005 | Motoyama | |
| 6,903,016 B2 | 6/2005 | Cohen | |
| 6,924,226 B2 | 8/2005 | Cohen | |
| 6,933,609 B2 | 8/2005 | Narukawa | |
| 6,964,874 B2 | 11/2005 | Werner et al. | |
| 7,105,434 B2 | 9/2006 | Cohen | |
| 7,144,805 B2 | 12/2006 | Chen et al. | |
| 7,193,327 B2 | 3/2007 | Yu et al. | |
| 7,576,006 B1 | 8/2009 | Yu et al. | |
| 7,648,899 B1 | 1/2010 | Banerji et al. | |
| 7,670,646 B2 | 3/2010 | Ahn et al. | |
| 7,799,671 B1 | 9/2010 | Banerji et al. | |
| 9,735,051 B2 * | 8/2017 | Murray | H01L 21/76879 |
| 2003/0064607 A1 | 4/2003 | Leu et al. | |
| 2005/0245068 A1 * | 11/2005 | Gambino | H01L 21/76807 438/625 |
| 2014/0061918 A1 * | 3/2014 | Jezewski | H01L 21/2855 257/751 |
| 2014/0183739 A1 * | 7/2014 | Li | H01L 21/76847 257/751 |
| 2014/0210041 A1 | 7/2014 | Burke et al. | |
| 2015/0287675 A1 | 10/2015 | Shaviv | |
| 2016/0309596 A1 | 10/2016 | Shaviv et al. | |

* cited by examiner

SEMICONDUCTOR DEVICE INTERCONNECT STRUCTURES FORMED BY METAL REFLOW PROCESS

TECHNICAL FIELD

This disclosure generally relates to semiconductor fabrication techniques and, in particular, techniques for fabricating interconnect structures for semiconductor devices.

BACKGROUND

As the lateral dimensions of interconnect structures continue to decrease, the ability to fabricate conductive vias without voids or seams has become extremely challenging. Conventional methods for fabricating interconnect structures involve lining a via hole (which is etched in an ILD (inter-level dielectric) layer) with a conformal barrier layer and a seed layer, followed by copper (Cu) deposition process such as electroplating to fill the via hole with copper. With decreases in the lateral dimensions, the use of a barrier layer and a seed layer leave little volume within the via holes for copper to be deposited by electroplating. As barrier layers are critical in BEOL (back-end-of-line) structures to prevent diffusion of the interconnect metallization into the material of the ILD layer (e.g., low-k dielectric material) or the underlying silicon, techniques are needed which can properly fill interconnect vias having high aspect ratios (height/width), e.g., aspect ratio that is 5 or greater. Approaches such as direct plating of copper on conventional liner materials, without the need for a seed layer, requires specialized plating baths. Although Cu direct plating on ruthenium (Ru) layers has been demonstrated, ruthenium alone is insufficient to act as a barrier to copper diffusion and a secondary barrier layer is required. Atomic layer deposition (ALD) or chemical-vapor deposition (CVD) techniques have been used to fill vias due to their improved conformality, but the use of such techniques results in vias that have much higher impurities than those corresponding to physical vapor deposition (PVD) approaches.

SUMMARY

Embodiments of the invention generally include semiconductor device interconnection structures that are formed using a metal reflow process, as well as methods for fabricating interconnect structures using metal reflow techniques.

For example, one embodiment of the invention includes a method to fabricate a semiconductor device. The method includes: forming an opening in an ILD layer, wherein the opening comprises a via hole and a trench; depositing a layer of diffusion barrier material to cover the ILD layer and to line the opening with the diffusion barrier material; depositing a layer of first metallic material on the layer of diffusion barrier material to cover the ILD layer and to line the opening with the first metallic material; performing a reflow process to allow the layer of first metallic material to reflow into the opening and at least partially fill the via hole with the first metallic material; and depositing a layer of second metallic material to at least partially fill a remaining portion of the opening in the ILD layer.

Another embodiment of the invention includes a semiconductor device. The semiconductor device includes an ILD layer comprising an opening, wherein the opening comprises a via hole and a trench. The opening is lined with a layer of diffusion barrier material. The opening comprises a first metallic material that at least partially fills the via hole, and a second metallic material that fills a remaining portion of the opening of the ILD layer, wherein the first metallic material comprises a reflowed metallic material. In one embodiment, the first metallic material comprises Cobalt and the second metallic material comprises copper.

In another embodiment, the first metallic material comprises a reflowed metallic material that completely fills the via hole and the second metallic material completely fills the trench. In yet another embodiment of the invention, the first and second metallic materials comprise reflowed metallic materials.

Other embodiments will be described in the following detailed description of embodiments, which is to be read in conjunction with the accompanying figures.

DETAILED DESCRIPTION OF EMBODIMENTS

Figure 1:
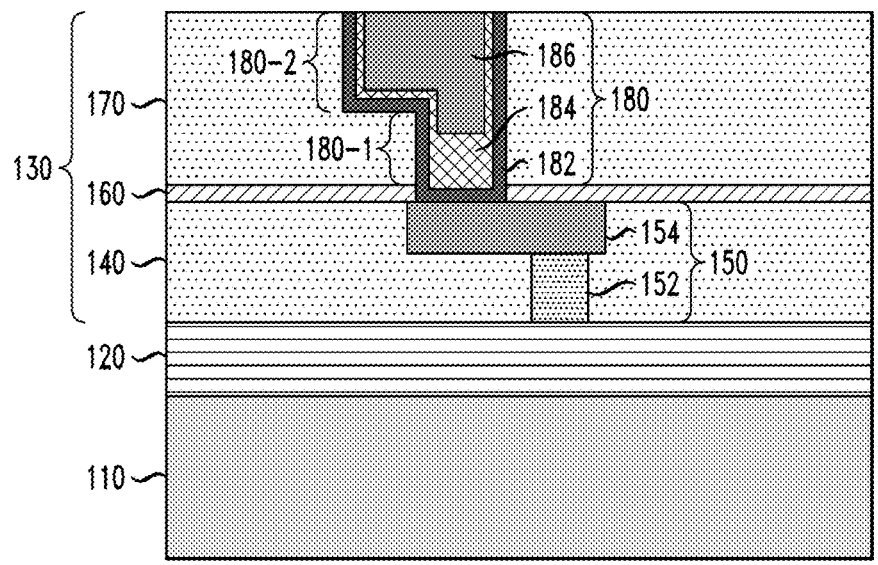
FIG. 1 is cross-sectional schematic view of a semiconductor device having an interconnect structure formed using a metal reflow process, according to an embodiment of the invention.

Embodiments of the invention will now be discussed in further detail with regard to semiconductor device interconnection structures that are formed using metal reflow techniques, as well as methods for fabricating interconnect structures using metal reflow techniques. As explained in further detail below, methods according to embodiments of the invention involve depositing a layer of metallic material (or reflow metal) over an ILD layer having lithographically defined semiconductor trench and via structures, wherein the metallic material undergoes a reflow process via thermal annealing to enable the metallic material to reflow and diffuse into the via holes. With the metal reflow process, the via holes can be either partially or completely filled with the reflowed metallic material. The trenches and any remaining portion of the via holes are then filled by depositing at least one other layer of metallic material (e.g., electroplated copper, reflowed metallic material, etc.), thereby allowing for improved filling capability for high aspect ratio vias and aggressively scaled features (e.g., less than 20 nm). Indeed, the smaller aspect ratios in the remaining unfilled portions of the via holes can then be readily filled using conventional electrochemical copper plating, for example. The techniques discussed herein enable the fabrication of interconnect structures which are a composite of a reflow metal (e.g., Co) and an electroplated metal (e.g., Cu) or which are completely comprised of reflowed metallic material.

It is to be understood that the various layers, structures, and regions shown in the accompanying drawings are schematic illustrations that are not drawn to scale. In addition, for ease of explanation, one or more layers, structures, and regions of a type commonly used to form semiconductor devices or structures may not be explicitly shown in a given drawing. This does not imply that any layers, structures, and regions not explicitly shown are omitted from the actual semiconductor structures.

Furthermore, it is to be understood that the embodiments discussed herein are not limited to the particular materials, features, and processing steps shown and described herein. In particular, with respect to semiconductor processing steps, it is to be emphasized that the descriptions provided herein are not intended to encompass all of the processing steps that may be required to form a functional semiconductor integrated circuit device. Rather, certain processing steps that are commonly used in forming semiconductor devices, such as, for example, wet cleaning and annealing steps, are purposefully not described herein for economy of description.

Moreover, the same or similar reference numbers are used throughout the drawings to denote the same or similar features, elements, or structures, and thus, a detailed explanation of the same or similar features, elements, or structures will not be repeated for each of the drawings. It is to be understood that the terms "about" or "substantially" as used herein with regard to thicknesses, widths, percentages, ranges, etc., are meant to denote being close or approximate to, but not exactly. For example, the term "about" or "substantially" as used herein implies that a small margin of error is present, such as 1% or less than the stated amount.

FIG. 1 is cross-sectional schematic view of a semiconductor device having an interconnect structure formed using a metal reflow process, according to an embodiment of the invention. In particular, FIG. 1 schematically illustrates a semiconductor device 100 comprising a substrate 110, a FEOL (front-end of line) structure 120, and a BEOL (back-end-of-line structure) 130. In one embodiment, the substrate 110 comprises a bulk semiconductor substrate formed of, e.g., silicon, or other types of semiconductor substrate materials that are commonly used in bulk semiconductor fabrication processes such as germanium, silicon-germanium alloy, silicon carbide, silicon-germanium carbide alloy, or compound semiconductor materials (e.g. III-V and II-VI). Non-limiting examples of compound semiconductor materials include gallium arsenide, indium arsenide, and indium phosphide. The thickness of the substrate 110 will vary depending on the application. In another embodiment, the substrate 110 comprises a SOI (silicon on insulator) substrate, which comprises an insulating layer (e.g., buried oxide layer) disposed between a base semiconductor substrate (e.g., silicon substrate) and an active semiconductor layer (e.g., active silicon layer) in which active circuit components (e.g., field effect transistors) are formed.

The FEOL structure 120 comprises various semiconductor devices and components that are formed in or on the active surface of the semiconductor substrate 110 to provide integrated circuitry for a target application. For example, the FEOL structure 120 comprises FET devices (such as FinFET devices, planar MOSFET device, etc.), bipolar transistors, diodes, capacitors, inductors, resistors, isolation devices, etc., which are formed in or on the active surface of the semiconductor substrate 110. The BEOL structure 130 is formed on the FEOL structure 120 to connect the various components of the FEOL structure 120. The BEOL structure 130 comprises multiple levels of vertical and horizontal wiring embedded in layers of dielectric material, wherein conductive vias provide vertical wiring between layers, and interconnects provide horizontal wiring in a given layer. A BEOL fabrication process involves successively depositing and patterning of multiple layers of dielectric and metallic material to form a network of electrical connections to connect the FEOL devices and to provide I/O contact pads to connect to external components.

More specifically, in the example embodiment shown in FIG. 1, the BEOL structure 130 comprises a first insulating layer 140, an interconnect structure 150 formed in the first insulating layer 140, a capping layer 160, a second insulating layer 170, and an interconnect structure 180 formed in the second insulating layer 170. The interconnect structure 150 comprises a via contact 152 (or via plug) and a metal line 154 (e.g., level M1 metallization). The first insulating layer 140 comprises, for example, a PMD (pre-metal dielectric) layer) that is directly deposited on the FEOL structure 120 and a first ILD (inter-level dielectric) layer formed over the PMD layer. The via contact 152 is formed in the PMD layer, and the metal line 154 is formed in the first ILD layer.

In one embodiment, the via contact 152 is formed by etching a via hole in the PMD layer, lining the via hole with a diffusion barrier/liner material (e.g., TiN), and filling the via hole with a metallic material such as aluminum (Al), tungsten (W) or copper (Cu). A CMP process is performed to remove the overburden of the metallic material used to fill the via hole, and to planarize the structure surface prior to deposition of the first ILD layer. The first ILD layer is deposited on the planarized PMD layer and then patterned to form trenches, wherein the trenches are lined with a diffusion barrier material/seed layer, and then filled with metallic material such as copper to form the metal line 154 (and other metal lines not shown) using known techniques. It is to be understood that while only one via contact 152 and one metal line 154 is shown in FIG. 1 for ease of illustration, the first insulating layer 140 would have many via plugs and metal lines formed therein as part of the initial layers of the BEOL structure 130, wherein the via plugs would provide vertical contacts between terminals (e.g., source/drain regions) of the active circuitry of the FEOL structure 120 and the horizontal wiring of the first metallization level (e.g., metal line 154).

The capping layer 160 serves to insulate the upper surface of the metal line 154 (and other portions of the associated metallization layer) from the second insulating layer 170 that is formed over the capping layer 160. The capping layer 160 comprises an insulating material such as SiN or any other suitable insulating material that is commonly utilized to form capping layers in BEOL structures. The insulating layers 140 and 170 may be formed of any suitable material such as, e.g., silicon oxide, silicon nitride, hydrogenated silicon carbon oxide, silicon based low-k dielectrics, porous dielectrics, or organic dielectrics including porous organic dielectrics. In addition, the insulating layers 140 and 170 may be formed using known deposition techniques, such as, for example, ALD, CVD, PECVD, spin on deposition, or PVD, followed by a standard planarization process (e.g., CMP) to planarize the upper surface of the semiconductor structure between deposition of different insulating layer.

The second insulating layer 170 comprises an ILD layer that is lithographically patterned to form an opening (e.g., opening 172, FIG. 4) which is filled with metallic material to form the interconnection structure 180. The interconnection structure 180 comprises a diffusion barrier layer 182, a first metallic material 184, and a second metallic material 186, which collectively form a via contact 180-1 and a metal line 180-2. As shown in FIG. 1, the via contact 180-1 is partially filled with the first metallic material 184 and the second metallic material 186, and the metal line 180-2 is completely filled with the second metallic material. In one embodiment of the invention, the first metallic material 184 comprises a reflowed metallic material (such as Cobalt) which is deposited and then thermally annealed to allow the metallic material to flow into the via hole and partially fill the via hole with the metallic material 184. Further, in one embodiment of the invention, the second metallic material 186 is deposited to fill an upper portion of the via hole and to fill the trench opening to form the interconnect structure 180, which is a composite of the first metallic material 184 (reflowed metal) and the second metallic material 186 (e.g., electroplated copper). A method for fabricating the semiconductor device 100 shown in FIG. 1 will be discussed in further detail below with reference to FIGS. 4, 5, 6, 7A and 7B.

Figure 2:
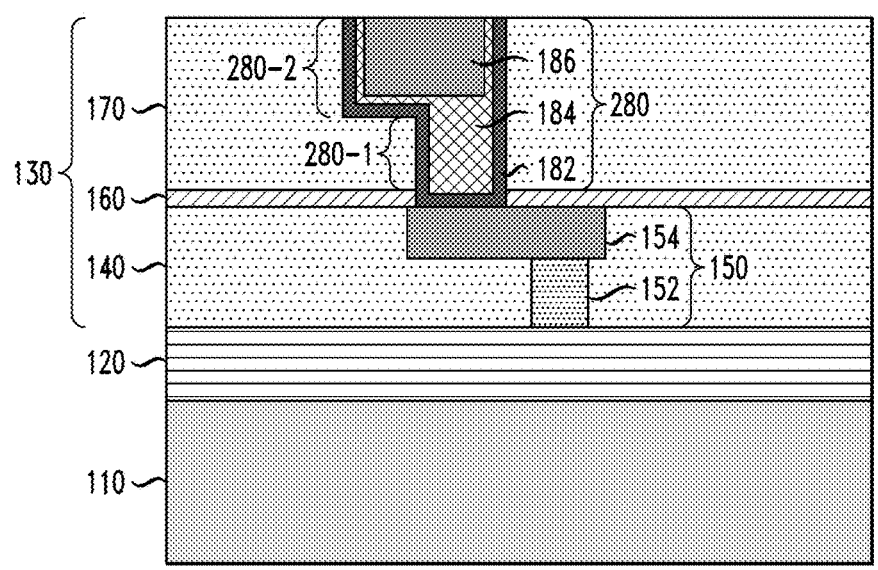
FIG. 2 is cross-sectional schematic view of a semiconductor device having an interconnect structure formed using a metal reflow process, according to another embodiment of the invention.

In another embodiment, the metal reflow process results in completely filling the via holes in the ILD layer 170 with the reflow metal. For example, FIG. 2 is cross-sectional schematic view of a semiconductor device 200 having an interconnect structure 280 formed using a metal reflow process, according to another embodiment of the invention. The semiconductor structure 200 shown in FIG. 2 is similar to the semiconductor structure 100 shown in FIG. 1 except that the interconnect structure 280 shown in FIG. 2 comprises a via contact 280-1 that is completely filled with the first metallic material 184 (e.g., reflowed Co), and a metal line 280-2 that is completely filled with the second metallic material 186. A method for fabricating the semiconductor device 200 shown in FIG. 2 will be discussed in further detail below with reference to FIGS. 4, 5, 6, 8A and 8B.

Figure 3:
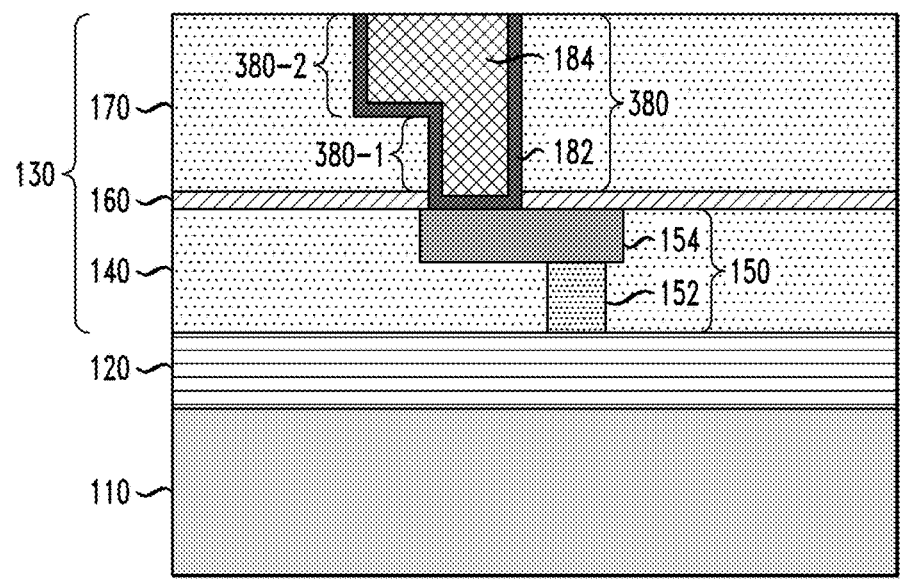
FIG. 3 is cross-sectional schematic view of a semiconductor device having an interconnect structure formed using a metal reflow process, according to another embodiment of the invention.

In yet another embodiment, the reflow process results in completely filling the via holes and corresponding trenches in the ILD layer 170 with reflowed metallic material. For example, FIG. 3 is cross-sectional schematic view of a semiconductor device 300 having an interconnect structure 380 formed using a metal reflow process, according to another embodiment of the invention. The semiconductor structure 300 shown in FIG. 3 is similar to the semiconductor structures shown in FIGS. 1 and 2 except that the interconnect structure 380 shown in FIG. 2 comprises a via contact 380-1 and a metal line 380-2 that are completely filled with the first metallic material 184 (e.g., reflowed Co) using one or more successive metal deposition and reflow processes. A method for fabricating the semiconductor device 300 shown in FIG. 3 will be discussed in further detail below with reference to FIGS. 4, 5, 6, and 9.

Figure 4:
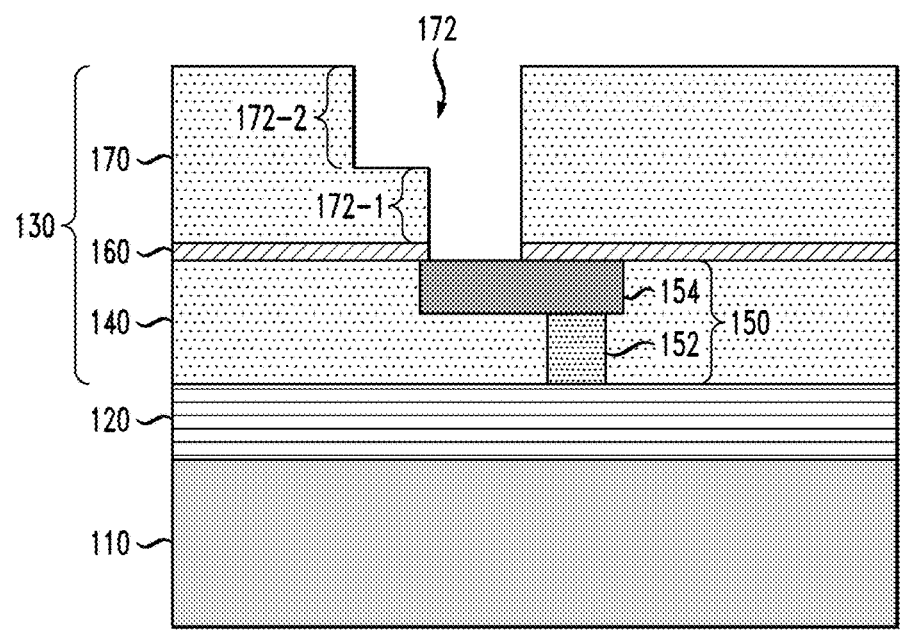
FIG. 4 is cross-sectional schematic view of a semiconductor device at an intermediate stage of fabrication wherein an opening is formed is an inter-level dielectric layer, according to an embodiment of the invention.
Figure 5:
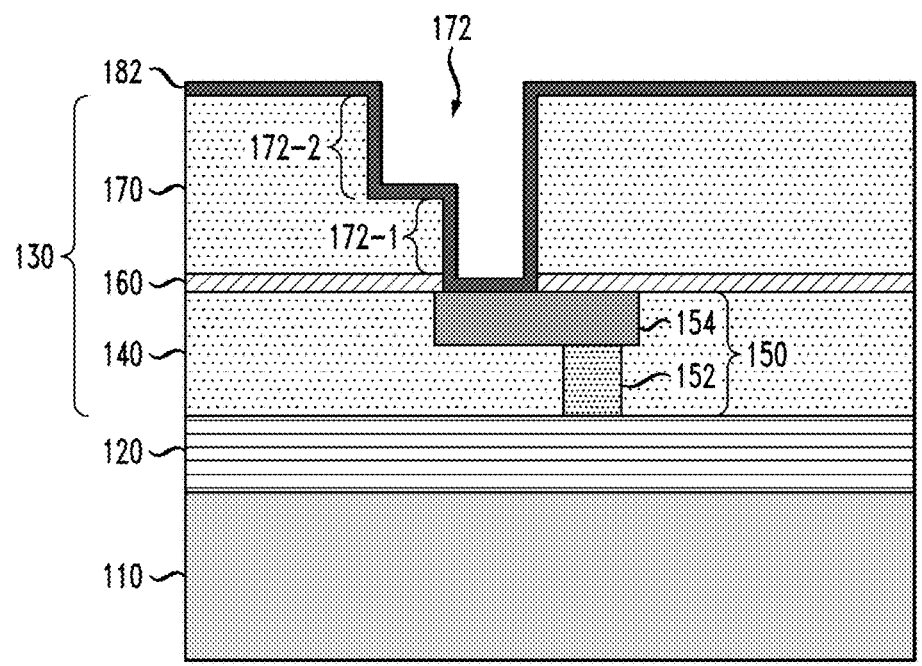
FIG. 5 is cross-sectional schematic view of the semiconductor device of FIG. 4 after depositing a conformal layer of diffusion barrier material over a surface of the semiconductor device to cover the inter-level dielectric layer and to line the opening with the diffusion barrier material, according to an embodiment of the invention.

Methods for fabricating the semiconductor devices shown in FIGS. 1, 2 and 3 according to embodiments of the invention will now be discussed in further detail with reference to FIGS. 4, 5, 6, 7A/7B, 8A/8B, and 9. Referring to FIG. 4, a cross-sectional schematic view of a semiconductor device is shown at an intermediate stage of fabrication wherein an opening is formed is an inter-level dielectric layer, according to an embodiment of the invention. In particular, FIG. 4 schematically illustrates an intermediate step that is commonly implemented in each of the process flows for constructing the different semiconductor devices shown in FIGS. 1, 2 and 3, wherein an opening 172 is formed in the second insulating layer 170 of the BEOL structure 130. The opening 172 comprises a via hole 172-1 and a trench 172-2. In one embodiment of the invention, the opening 172 is formed using any suitable etching technique that is commonly implemented for a "dual damascene" process, wherein both a via hole and a corresponding trench are formed in an ILD layer prior filling both the via hole and trench with metallic material. As further shown in FIG. 4, a portion of the capping layer 160 which is exposed at a bottom of the via hole 172-1 is etched away to expose a portion of the metal line 152 of the underlying interconnect structure 150. A next step that is commonly implemented in each of the process flows for constructing the different semiconductor devices shown in FIGS. 1, 2 and 3 includes depositing one or more thin conformal layers of barrier material to form a diffusion barrier layer. For example, FIG. 5 is cross-sectional schematic view of the semiconductor device of FIG. 4 after depositing one or more thin conformal layers of barrier material over the surface of the semiconductor device to form the diffusion barrier layer 182, according to an embodiment of the invention. As shown in FIG. 5, the diffusion barrier layer 182 is initially formed to cover the inter-level dielectric layer 170 and to line the opening 172 with the diffusion barrier material (i.e., line the horizontal and sidewall surfaces that define the opening 172).

Figure 6:
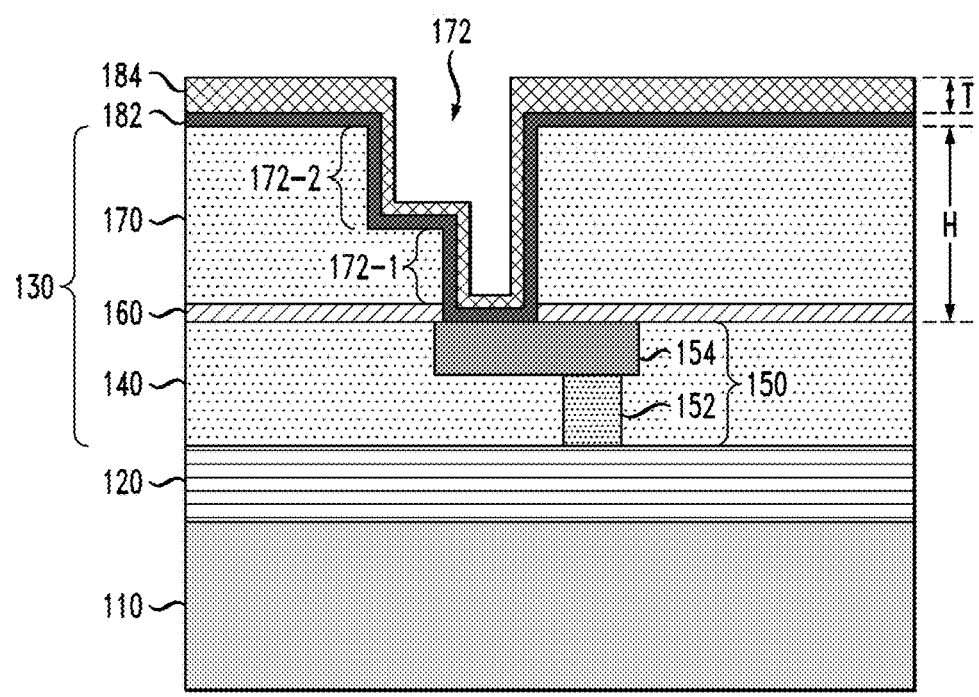
FIG. 6 is cross-sectional schematic view of the semiconductor device of FIG. 5 after depositing a layer of first metallic material over the surface of the semiconductor device to cover the inter-level dielectric layer and to line the opening with the first metallic material.

In accordance with an embodiment of the invention, the diffusion barrier layer 182 is formed of one or more layers of material that are sufficient to provide desired barrier properties for the given application. In addition, the material (s) of the diffusion barrier layer 182 are selected so that the diffusion barrier layer 182 serves as a wetting layer with a surface energy (which is higher than the insulating material forming the ILD layer 170) which facilies the reflow of metallic material that is subsequently deposited to fill or partially fill the opening 170. For example, the diffusion barrier layer 182 can be formed of one or more layers of material such as Ta, TaN, Ti, TiN, W, WN, or alloys of Ta, Ti or W, for example. The diffusion barrier layer 182 is formed using any suitable deposition process, such as PVD, CVD, or ALD for example, which provides a high degree of conformality wherein the corners, sidewalls, and bottoms of the trench and via features are covered evenly. A next step that is implemented in the process flows for constructing the different semiconductor devices shown in FIGS. 1, 2 and 3 includes depositing an initial layer of first metallic material (or reflow metallic material) which undergoes a subsequent reflow process to at least partially fill the opening 172 with the first metallic material and form at least portion of an interconnect structure within the opening 172. For example, FIG. 6 is cross-sectional schematic view of the semiconductor device of FIG. 5 after depositing a layer of the first metallic material 184 on the diffusion barrier layer 182 to cover the ILD layer 170 and to line the opening 172 with the first metallic material 184. The layer of first metallic material 184 can be deposited using PVD, CVD, ALD, or electroless plating, for example. The first metallic material can be Ta, Ti, Co, Ru, W, their alloys or their corresponding nitrides, for example. The type of reflow metallic material that is utilized, and the deposition process that is used to deposit the reflow metallic material, are factors that are considered to achieve desired reflow characteristics (e.g., reflow temperature, surface energy) and electrical characteristics (e.g., resistivity) for the resulting interconnect structures formed with the reflowed metal.

For example, it is desirable to minimize the thermal annealing temperature that is used to reflow the first metallic material 184. In one embodiment of the invention, a subsequent reflow process is preferably performed at a reflow temperature in a range of about 200 degrees Celsius to about 500 degrees Celsius, so as to prevent thermal damage to other structures/components (e.g., low-k dielectric material of ILD layer) of the existing BEOL structure 130. Metallic materials such as Co and Ru have low reflow temperatures which fall within the desired range. Metallic materials such as Ta and W have higher reflow temperatures than Co and Ru, but such metallic materials can be reflowed at temperatures that still fall within the desired range. Other factors that can be considered when selecting the type of reflow metallic material to utilize include, for example, how well the metallic material wets the underlying diffusion barrier layer 182, the amount of surface energy that must be overcome to effect reflow of the metallic material, etc., so as to optimize the reflow process.

Moreover, the type of deposition process that is used to deposit the reflow metallic material will result in a metallic film with different levels of impurities. For example, the use of a sputtering process (e.g., PVD) to deposit the reflow metal results in less impurity levels in the reflow metal, as compared to CVD or ALD deposition methods. Indeed, from experimentation, it is been determined that the level of impurities in a PVD Co film can be less than 200 ppm, whereas the impurity level of a CVD or ALD deposited metal film can be greater than 1000 ppm (with impurities such as C, Cl, O, S). With higher levels of impurities present in a given reflow metal, the time for performing the reflow increases and/or the required annealing temperature to effect reflow increases. Moreover, higher levels of impurities in a given reflow metal results in higher resistivity interconnect structures. As such, it is desirable to minimize the level of impurities in the reflow metallic material 184 that is deposited.

Referring again to FIG. 6, the amount of the first metallic material 184 that is deposited will vary depending on how much of the opening 172 is to be filled with the first metallic material 184 following the reflow process. More specifically, in one embodiment of the invention, the degree to which the via holes and/or trenches in a given ILD layer are filled with the reflow metal is a function of a nominal thickness T of the blanket layer of first metallic material 184 overlying the surface of the ILD layer 170 and the total height H of the via hole 172-1 and trench 172-2.

For example, depending on the number and the sizes of the etched openings formed in a given ILD layer, the initial layer of the first metallic material 184 (e.g., PVD Co) is formed with a nominal thickness T corresponding to a range of about 5% to about 60% of the total trench and via height H, to partially fill the via holes (e.g., via hole 172-1) with reflow metal at the completion of the reflow process. In addition, depending on the number and the sizes of the etched openings formed in a given ILD layer, the initial layer of the first metallic material 184 (e.g., PVD Co) is formed with a nominal thickness T of about 60% of the total trench and via height H, to completely fill the via holes (e.g., via hole 172-1) with the reflow metal at the completion of the reflow process. Moreover, depending on the number and the sizes of the etched openings formed in a given ILD layer, the initial layer of the first metallic material 184 (e.g., PVD Co) is formed with a nominal thickness T corresponding to a range of about 60% to about 150% of the total trench and via height H, to completely fill the openings (e.g., opening 172) with the reflowed metal at the completion of the reflow process.

Figure 7A:
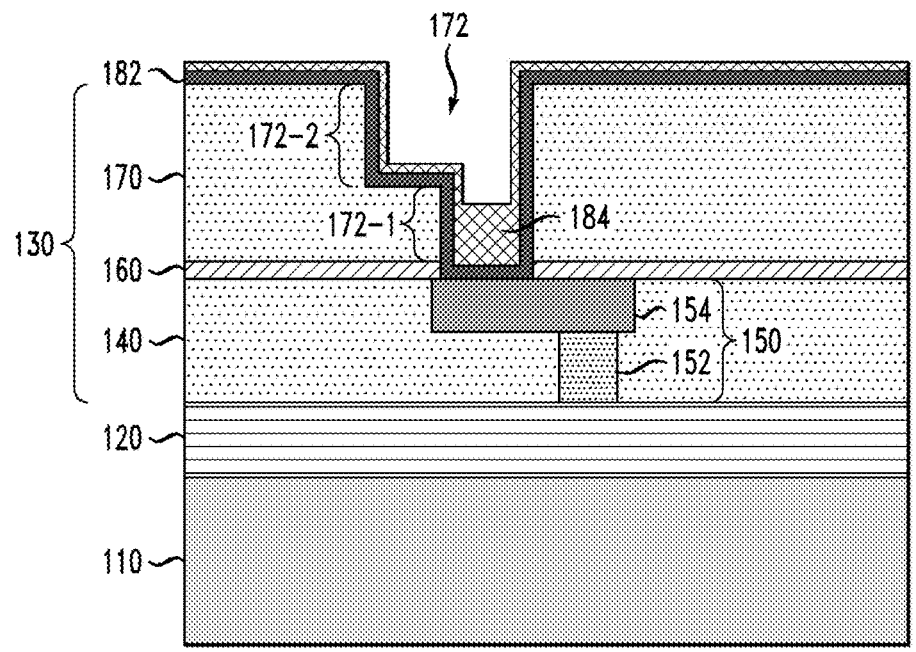
FIG. 7A is a cross-sectional view of the semiconductor device of FIG. 6 after performing a metal reflow process to allow the layer of first metallic material to reflow into the opening and partially fill the via hole with the first metallic material, according to an embodiment of the invention.
Figure 7B:
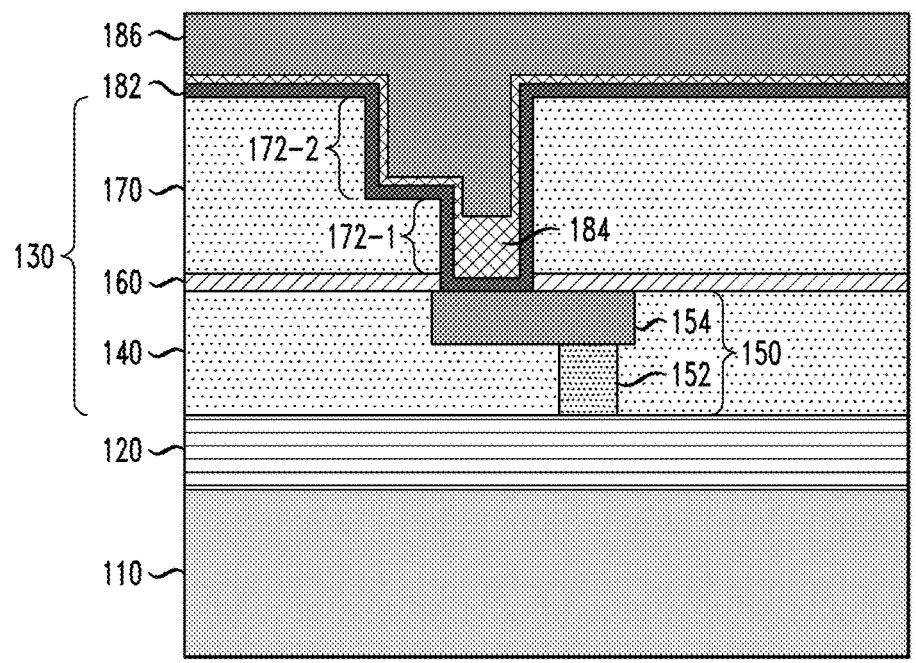
FIG. 7B is a cross-sectional view of the semiconductor device of FIG. 7A after depositing a layer of second metallic material to fill a remaining portion of the opening in the inter-level dielectric layer, according to an embodiment of the invention.

FIGS. 7A and 7B illustrate a process flow for forming an interconnect structure (e.g., the interconnect structure of 180 of FIG. 1) by partially filling the via hole 172-1 with reflowed metal, and filling the remaining portion of the opening 172 with another metal deposition process, according to an embodiment of the invention. In particular, FIG. 7A is a cross-sectional view of the semiconductor device of FIG. 6 after performing a metal reflow process to allow the layer of first metallic material 184 to reflow into the opening 172 and partially fill the via hole 172-1 with the first metallic material 184. In one embodiment of the invention, the metal reflow process is performing using a thermal annealing process in a forming gas (mixture of hydrogen and nitrogen) or other suitable gas atmosphere to reflow the first metallic material 184 (e.g., PVD Co) at a relatively low temperature (e.g., about 300 degrees Celsius). The reflow process allows the first metallic material 184 on the top surface of the ILD layer 170 and on the sidewall surfaces of the opening 172 to diffuse/flow towards the bottom of the via hole 172-1 and continue to fill the via hole 172-1 from the bottom up. As noted above, the initial nominal thickness T of the metallic material 184 is selected so that the via hole 172-1 is partially filled with the reflowed metal at the completion of the metal reflow process.

Following the metal reflow process, as shown in FIG. 7A, a remaining portion of the opening 172 comprises an upper portion of the via hole 172-1 and the entire trench 172-2. Next, another layer of metallic material is deposited to at least partially fill the remaining portion of the opening 172, as shown in FIG. 7B. In particular, FIG. 7B is a cross-sectional view of the semiconductor device of FIG. 7A after depositing a layer of second metallic material 186 to completely fill a remaining portion of the opening 172 in the ILD layer 170 with the second metallic material 186, according to an embodiment of the invention.

The second metallic material 186 may be W, Al, or Cu, for example, which is deposited using any suitable technique such as, e.g., electroplating, electroless plating, CVD, PVD, or ALD. In one embodiment of the invention, the second metallic material 186 comprises Cu which is deposited using an electroplating process. An optional seed layer (e.g., copper seed layer) can be deposited over the semiconductor structure of FIG. 7A prior to deposition of the layer of second metallic material 186 (e.g., electroplated copper), or the layer of second metallic material 186 can be deposited directly over the structure shown in FIG. 7A.

Following deposition of the second metallic material 186, the semiconductor structure shown in FIG. 7B is planarized via CMP to remove the portions of the diffusion barrier layer 182, the first metallic material 184, and the second metallic material 186 (overburden material) which extend above the ILD layer 170 to form the semiconductor device shown in FIG. 1. In particular, following the CMP process, the portions of the diffusion barrier layer 183, the reflowed first metallic material 184, and the second metallic material 186, which remain in the opening 172 form the electrical interconnect structure 180 in the ILD layer 170, as shown in FIG. 1.

Figure 8A:
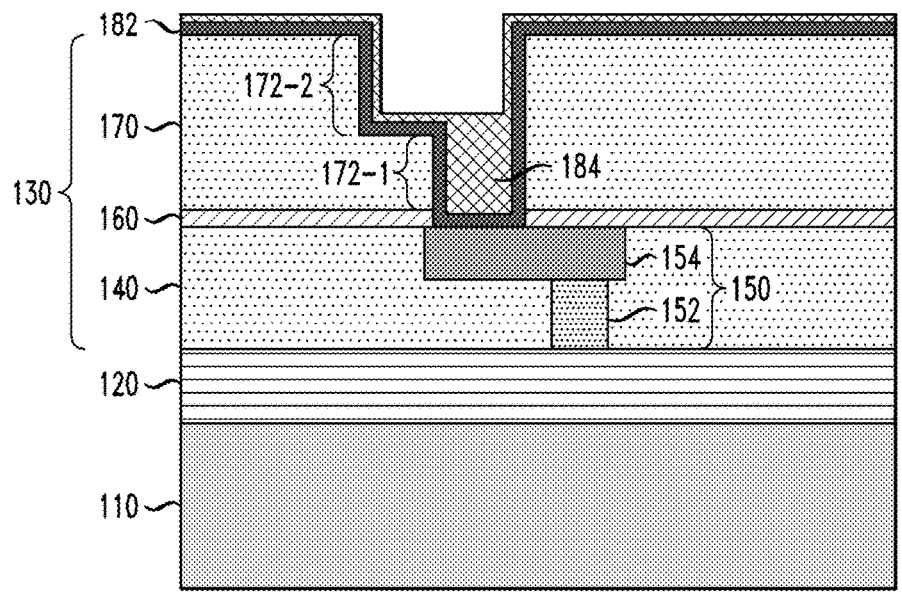
FIG. 8A is a cross-sectional view of the semiconductor device of FIG. 6 after performing a metal reflow process to allow the layer of first metallic material to reflow into the opening and completely fill the via hole with the first metallic material, according to another embodiment of the invention.
Figure 8B:
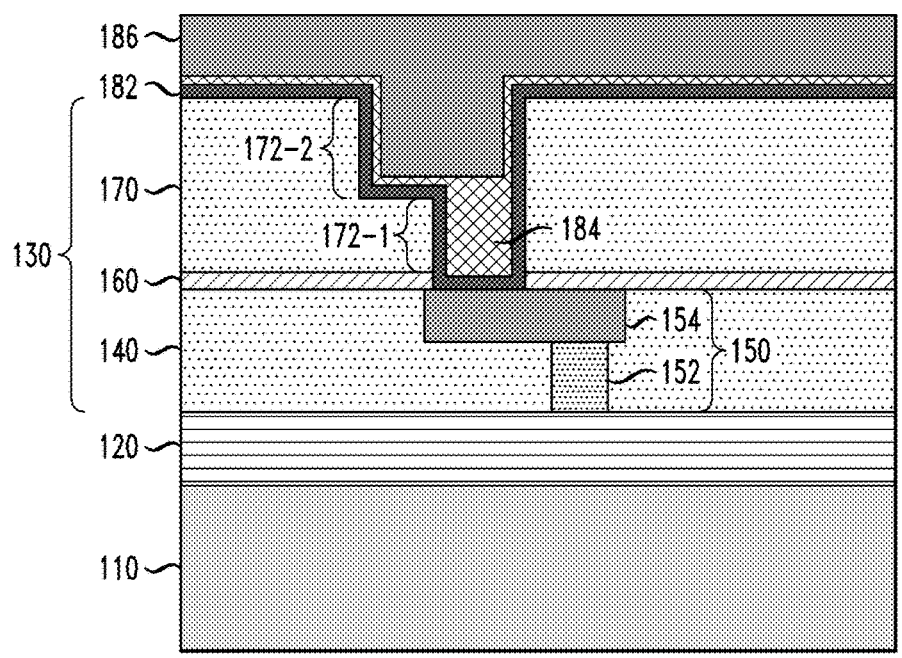
FIG. 8B is a cross-sectional view of the semiconductor device of FIG. 8A after depositing a layer of second metallic material to fill a remaining portion of the opening in the inter-level dielectric layer, according to another embodiment of the invention.

In another embodiment of the invention, FIGS. 8A and 8B illustrate a process flow for forming an interconnect structure (e.g., the interconnect structure of 280 of FIG. 2) by completely filling the via hole 172-1 with reflowed metal, and filling the remaining portion of the opening 172 with another metal deposition process. In particular, FIG. 8A is a cross-sectional view of the semiconductor device of FIG. 6 after performing a metal reflow process to allow the layer of first metallic material 184 to reflow into the opening 172 and completely fill the via hole 172-1 with the first metallic material 184. In one embodiment of the invention, the metal reflow process is performing using a thermal annealing process as discussed above, wherein the initial nominal thickness T of the metallic material 184 is selected so that the via hole 172-1 is completely filled with the reflowed metal at the completion of the metal reflow process.

Following the metal reflow process, as shown in FIG. 8A, a remaining portion of the opening 172 comprises the entire trench 172-2. The trench 172-2 is then filled by depositing another layer of metallic material, as shown in FIG. 8B. In particular, FIG. 8B is a cross-sectional view of the semiconductor device of FIG. 8A after depositing a layer of second metallic material 186 to completely fill a remaining portion of the opening 172 in the ILD layer 170 with the second metallic material 186, according to an embodiment of the invention. As noted above, the second metallic material 186 may be W, Al, or Cu, for example, which is deposited using any suitable technique such as, e.g., electroplating, electroless plating, CVD, or ALD.

Following deposition of the second metallic material 186, the semiconductor structure shown in FIG. 8B is planarized via CMP to remove the portions of the diffusion barrier layer 182, the first metallic material 184, and the second metallic material 186 (overburden materials), which extend above the ILD layer 170, to form the semiconductor device shown in FIG. 2. In particular, following the CMP process, the portions of the diffusion barrier layer 182, the reflowed first metallic material 184, and the second metallic material 186, which remain in the opening 172 form the electrical interconnect structure 280 as shown in FIG. 2.

Figure 9:
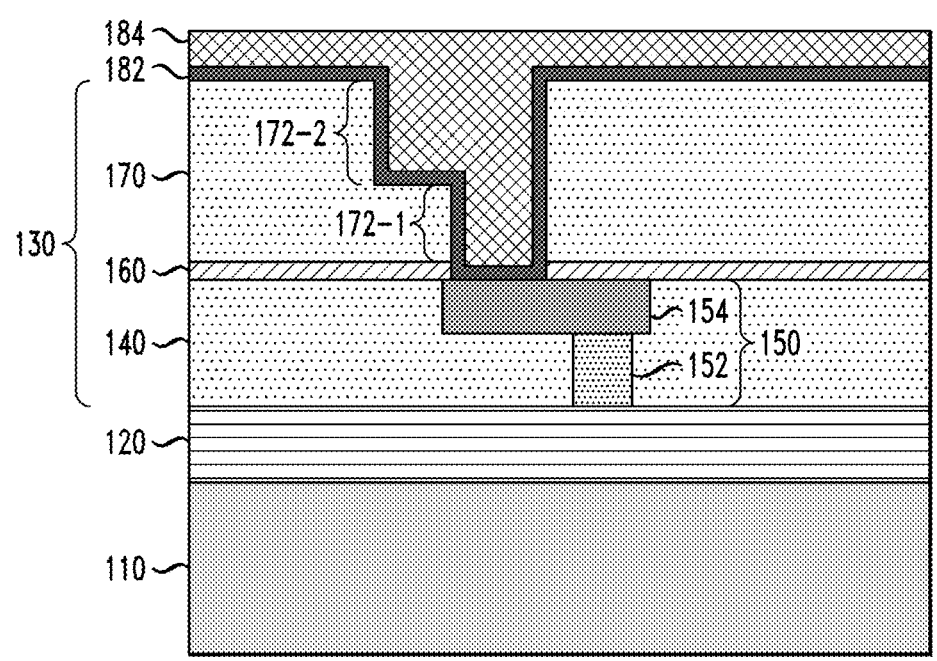
FIG. 9 is a cross-sectional view of the semiconductor device of FIG. 6 after performing a metal reflow process to allow the layer of first metallic material to reflow into the opening and completely fill the opening with the first metallic material, according to another embodiment of the invention.

In yet another embodiment of the invention, FIG. 9 illustrates a process flow for forming an interconnect structure (e.g., the interconnect structure of 380 of FIG. 3) by completely filling the via hole 172-1 and trench 172-2 with reflowed metal. In particular, FIG. 9 is a cross-sectional view of the semiconductor device of FIG. 6 after performing a metal reflow process to allow the layer of first metallic material 184 to reflow into the opening 172 and completely fill the via hole 172-1 and the trench 172-2 with the first metallic material 184. In one embodiment of the invention, the metal reflow process is performing using a thermal annealing process as discussed above, wherein the initial nominal thickness T of the metallic material 184 is selected so that the via hole 172-1 and the trench 172-2 are completely filled with the reflow metal at the completion of the metal reflow process.

In some embodiments, a single reflow metal deposition and reflow process may not be sufficient to completely fill the opening 172 with reflow material using only the initial layer of first metallic material 184. Indeed, depending on various factors such as the aspect ratio of the via openings, the reflow characteristics of the metals used, the process used to deposit the reflow metal, etc., a metal deposition and reflow process may be repeated two or more times to completely fill the opening 172 with reflow metal and form an interconnect structure that is void free and seam free. For instance, a first deposition process can be performed to deposit a first layer of reflow metal (e.g., Co), followed by a reflow process to either partially or completely fill the via holes with the reflow metal. Then, a second deposition process can be performed to deposit a second layer of the same reflow metal (e.g., Co), followed by a reflow process to either partially or completely fill the trenches with the second reflow metal. This process can be repeated any number of times to construct interconnect structures that are completely filled with reflowed metallic material.

After completely filling the opening 172 with the reflowed metallic material 184, the semiconductor structure shown in FIG. 9 is planarized via CMP to remove the portions of the diffusion barrier layer 182, and the reflowed metallic material 184 (overburden materials), which extend above the ILD layer 170, to form the semiconductor device shown in FIG. 3. In particular, following the CMP process, the portions of the diffusion barrier layer 182, and the reflowed first metallic material 184, which remain in the opening 172 form the electrical interconnect structure 380 as shown in FIG. 3.

Following the formation of the semiconductor devices shown in FIGS. 1, 2 and 3, the sequence of processing steps as discussed above with reference to FIGS. 4, 5, 6, 7A/7B, 8A/8B, and 9 can be repeated to construct one or more additional ILD layers with interconnect structures formed with reflowed metallic material, to complete the fabrication of the BEOL structure 130. The techniques discussed herein for constructing interconnect structures using reflowed metallic material enable the formation of high aspect ratio vias which are void free and seam free. Indeed, the techniques discussed herein serve to decouple the metallization processes between the via and metal line features, resulting in interconnects with improved metal fill quality as well as improved reliability performance for aggressively scaled features (e.g., less than 20 nm). The interconnect structures and techniques discussed herein are particularly useful in the fabrication of high performance interconnect structures for technology nodes of 7 nm, 5 nm, and below.

It is to be understood that the methods discussed herein can be incorporated in various semiconductor process flows to fabricate interconnect structures in conjunction with integrated circuits having analog and digital circuitry or mixed-signal circuitry. In particular, integrated circuit dies can be fabricated with various devices such as FinFET devices, bipolar transistors, metal-oxide-semiconductor transistors, diodes, capacitors, inductors, etc. An integrated circuit in accordance with the present invention can be employed in applications, hardware, and/or electronic systems. Suitable hardware and systems for implementing the invention may include, but are not limited to, personal computers, communication networks, electronic commerce systems, portable communications devices (e.g., cell phones), solid-state media storage devices, functional circuitry, etc. Systems and hardware incorporating such integrated circuits are considered part of the embodiments described herein.

Although exemplary embodiments have been described herein with reference to the accompanying figures, it is to be understood that the invention is not limited to those precise embodiments, and that various other changes and modifications may be made therein by one skilled in the art without departing from the scope of the appended claims.

We claim:

1. A semiconductor device, comprising:
   an ILD (inter-level dielectric) layer comprising an opening, wherein the ILD layer is formed as part of a BEOL (back-end-of-line) structure and further wherein the opening comprises a via hole and a trench having sidewalls which is disposed over the via hole;
   wherein the opening is lined with a layer of diffusion barrier material;
   wherein the opening comprises a first metallic material that is disposed at a bottom of the via hole and which at least partially fills the via hole and lines the sidewalls of the trench, wherein the first metallic material comprises reflowed Cobalt; and
   wherein the opening comprises a second metallic material that is in physical contact with the first metallic material and fills a remaining portion of the opening of the ILD layer, wherein the second metallic material is different than the first metallic material; and
   wherein the second metallic material is in physical contact with the reflowed Cobalt.

2. The semiconductor device of claim 1, wherein the second metallic material comprises copper.

3. The semiconductor device of claim 1, wherein the second metallic material comprises a reflowed metallic material.

4. The semiconductor device of claim 1, wherein the second metallic material comprises W or Al.

5. The semiconductor device of claim 1, further comprising a seed layer disposed between the first metallic material and the second metallic material.

6. A semiconductor device, comprising:
   an ILD (inter-level dielectric) layer comprising a metallic interconnect structure disposed within an opening etched into the ILD layer, wherein the ILD layer is formed as part of a BEOL (back-end-of-line) structure and further wherein the opening comprises a via hole and a trench which is disposed over the via hole;
   wherein the metallic interconnect structure comprises a conductive via formed in the via hole and a metal line formed in the trench, which is disposed over the conductive via;
   wherein the conductive via comprises a first metallic material, wherein the first metallic material comprises reflowed Cobalt which is disposed at a bottom of the via hole and which completely fills the via hole; and
   wherein the metal line comprises a second metallic material which fills the trench and which is formed in physical contact with the reflowed Cobalt of the conductive via, wherein the second metallic material is different than the first metallic material.

7. The semiconductor device of claim 6, wherein the second metallic material comprises copper.

8. The semiconductor device of claim 6, wherein the second metallic material comprises W or Al.

9. The semiconductor device of claim 6, wherein the second metallic material comprises a reflowed metal material.

10. The semiconductor device of claim 6, wherein the metallic interconnect structure comprises a seed layer disposed between the the first metallic material and the second metallic material.

11. The semiconductor device of claim 10, wherein the metallic interconnect structure comprises a liner layer which is disposed between the ILD layer and the metal line, and between the ILD layer and an upper portion of the conductive via, wherein the liner layer is formed by the reflowed Cobalt.

* * * * *